US009427762B2

(12) United States Patent
Huang et al.

(10) Patent No.: US 9,427,762 B2
(45) Date of Patent: Aug. 30, 2016

(54) GAS INJECTOR AND COVER PLATE ASSEMBLY FOR SEMICONDUCTOR EQUIPMENT

(71) Applicant: HERMES-EPITEK CORPORATION, Taipei (TW)

(72) Inventors: Tsan-Hua Huang, Tainan (TW); Tsung-Hsun Han, Kaohsiung (TW); Paul Wong, Johor (MY); Miao-Chan Wu, Kaohsiung (TW)

(73) Assignee: HERMES-EPITEK CORPORATION, Taipei (TW)

( * ) Notice: Subject to any disclaimer, the term of this patent is extended or adjusted under 35 U.S.C. 154(b) by 71 days.

(21) Appl. No.: 14/186,429

(22) Filed: Feb. 21, 2014

(65) Prior Publication Data
US 2014/0239091 A1    Aug. 28, 2014

(30) Foreign Application Priority Data

Feb. 23, 2013    (TW) .............................. 102106341 A

(51) Int. Cl.
*B05B 1/24*      (2006.01)
*B05B 15/02*     (2006.01)
*C23C 16/44*     (2006.01)
*C23C 16/455*    (2006.01)

(52) U.S. Cl.
CPC .......... *B05B 15/02* (2013.01); *C23C 16/4401* (2013.01); *C23C 16/45565* (2013.01); *C23C 16/45572* (2013.01); *C23C 16/45574* (2013.01)

(58) Field of Classification Search
USPC ....................................................... 239/128
See application file for complete search history.

(56) References Cited

U.S. PATENT DOCUMENTS

| | | |
|---|---|---|
| 5,558,717 A * | 9/1996 | Zhao et al. .................. 118/715 |
| 6,309,465 B1 | 10/2001 | Jurgensen et al. |
| 6,379,466 B1 * | 4/2002 | Sahin et al. .................. 118/724 |
| 6,626,998 B1 | 9/2003 | Dunham |
| 6,786,973 B2 | 9/2004 | Strauch et al. |
| 7,033,921 B2 | 4/2006 | Jurgensen |
| 7,083,702 B2 * | 8/2006 | Blonigan et al. ........ 156/345.47 |
| 7,128,785 B2 | 10/2006 | Kaeppeler et al. |
| 7,147,718 B2 | 12/2006 | Jurgensen et al. |
| 7,294,207 B2 | 11/2007 | Strauch et al. |
| 8,074,599 B2 * | 12/2011 | Choi et al. ................ 118/723 R |
| 8,328,939 B2 * | 12/2012 | Choi et al. .................... 118/715 |
| 8,357,435 B2 * | 1/2013 | Lubomirsky et al. ........ 427/569 |
| 8,709,162 B2 * | 4/2014 | Leung et al. ................. 118/728 |
| 2004/0013800 A1 | 1/2004 | Strauch et al. |
| 2004/0231599 A1 | 11/2004 | Schwambera et al. |
| 2009/0064935 A1 | 3/2009 | Dauelsberg et al. |
| 2011/0146571 A1 * | 6/2011 | Bartlett et al. ................ 118/667 |
| 2011/0237051 A1 | 9/2011 | Hess et al. |

* cited by examiner

*Primary Examiner* — Len Tran
*Assistant Examiner* — Adam J Rogers
(74) *Attorney, Agent, or Firm* — Huffman Law Group, PC

(57) ABSTRACT

A gas injector and cover plate assembly includes a cover plate, a gas injector and a ceiling. The cover plate includes cooling fluid channels. The gas injector is configured to be located on the cover plate, and includes a gas distributor, a fluid-cooling gas transmitter, gas spraying plates and a conducting cone. The gas distributor distributes gases and a gas transmitter cooling fluid. The gas distributor includes a gas conduit for introducing a first gas. The fluid-cooling gas transmitter connects the gas distributor to introduce the gas transmitter cooling fluid to form cooling fluid walls and the first gas and the gases. The gas spraying plates and the conducting cone are located beneath the fluid-cooling gas transmitter.

9 Claims, 11 Drawing Sheets

GAS INJECTOR AND COVER PLATE ASSEMBLY FOR SEMICONDUCTOR EQUIPMENT

CLAIM OF PRIORITY

The present application claims priority from Taiwan Application No. 102106341, filed on Feb. 23, 2013 and entitled "GAS INJECTOR AND COVER PLATE ASSEMBLY FOR SEMICONDUCTOR EQUIPMENT", the contents of which are expressly incorporated herein by reference in their entirety.

BACKGROUND OF THE DISCLOSURE

1. Field of the Disclosure

The invention generally relates to a gas injector and a cover plate assembly applied in semiconductor equipment, and more particularly to a temperature-controllable cover plate assembly and a detachable gas injector thereon.

2. Description of the Related Art

In a thin film deposition process, the temperature of the lower surface of a ceiling attached on a cover plate must be controlled at about 300° C. in order to avoid the accumulation of particles on the lower surface of the ceiling and subsequent dropping of particles on a wafer in the manufacturing process, leading to a poor yield ratio of production. The temperature of the lower surface of the ceiling is dependent on a combination of the structural arrangement and cooling methods between the cover plate and the ceiling.

Reaction gasses in the thin film growth process are horizontally injected above a susceptor by a gas injector for mixing, and films are then deposited on a wafer through physical or chemical reactions induced by heating. The injector is designed to horizontally inject the reaction gases and render the reaction gases uniformly distributed on the surface of the rotating susceptor so as to form a uniform boundary layer on the surface of the susceptor to facilitate the deposition of thin films. In addition, the spacing and angle of injector outlets also have a decisive influence on process result.

The conventional cover plate is a single-layer structure with direct water cooling. A space exists between a ceiling attached on the cover plate and the cover plate for introducing a gas mixture of gases with different flow rates to control the temperature of the lower surface of the ceiling in order to prevent accumulation of particles in the process attached to the lower surface of the ceiling and the subsequent dropping of particles on a wafer in manufacturing process so as to degrade yield ratio of production. This design must use hydrogen (H2), nitrogen (N2) and a mass flow controller (MFC) to adjust different gas combinations and different flow rates of gas, and uniformly maintain the distance between the ceiling and the cover plate at 0.1 mm, to facilitate flow uniformity of the gas combination and to achieve uniformity of temperature.

Conventional injectors horizontally inject reaction gases above a susceptor in a chamber in a thin film growth process; the gases mix and deposit on a substrate to form a thin film through physical or chemical reactions induced by heating. A one-piece injector is formed by combining multiple components via brazing with disadvantages of lower yield rate and easy leakage of cooling water due to cloggy narrow fluid conduit rendering it necessary to replace the entire injector. Moreover, the pitch between outlets of the injector is fixed, unable to be adjusted, which limits the adjustments of parameters such as flow speeds and flow field/distribution. The whole injector must be replaced in order to change flow speeds and flow field.

SUMMARY OF THE INVENTION

The invention provides a gas injector and cover plate assembly to prevent the accumulation of particles attached on the lower surface of a ceiling in processing thereby improving production. Also provided are enhancements including adjustable flow velocities and flow field/distribution, and facilitation of process development.

One feature is a two layer design of a cover plate, in which two fluids having different thermal conductivities and temperatures can be introduced into each layer respectively to adjust the temperature of the lower surface of a ceiling attached on the cover plate via thermal conduction to prevent accumulation of particles on the lower surface of the ceiling and subsequent dropping of particles on a wafer during deposition processes to improve yield ratio.

The gas injector comprises a plurality of components including a gas distributor, a fluid-cooling gas transmitter, a plurality of gas spraying plates and a conducting cone. The gas injector is designed as a porous showerhead for uniform distribution of gas. The fluid-cooling gas transmitter can be replaced to save cost if the fluid-cooling gas transmitter leaks due to repeatedly being heated. A newly designed gas spraying plate can be used to replace the original gas spraying plate without replacing the whole gas injector when the pitch between adjacent gas spraying plates needs to be adjusted. Thus, the gas injector of the invention yields the advantages of new functions, lower cost and easy maintenance.

The temperature adjustable cover plate comprises two-layers of cooling fluid channels, each with independent temperature control to adjust the temperature of the ceiling. The gas injector with a detachable structure comprises a gas distributor, a fluid-cooling gas transmitter, a plurality of gas spraying plates and a conducting cone. The gas injector is able to adjust pitches between the gas spraying plates and incline angles of the gas spraying plates, so as to adjust flow speeds and flow field(s) of gases and to facilitate process development.

In one embodiment, the invention provides a gas injector and cover plate assembly comprising a cover plate, a gas injector and a ceiling. The cover plate comprises a plurality of cooling fluid channels. The gas injector attached to the cover plate comprises a gas distributor, a fluid-cooling gas transmitter, a plurality of gas spraying plates and a conducting cone. The gas distributor uniformly distributes a plurality of gases and cooling fluids; the gas distributor comprises a gas conduit through the gas distributor for introducing a first gas. The fluid-cooling gas transmitter connects the gas distributor and introduces the first gas, the gases and the cooling fluids to form a plurality of cooling fluid walls. Independent channels introduce the cooling fluids that form the plurality of cooling fluid walls. The first gas channel connects the gas conduit. The gas channels introduces the gases. The independent channels are between the two adjacent gas channels, and outside the gas channels. A plurality of gas spraying plates and a conducting cone are sequentially located beneath the fluid-cooling gas transmitter. The two adjacent gas spraying plates change a flow direction of one of the gases, and the gas spraying plate and the conducting cone change a flow direction of the first gas. The ceiling attaches to a surface of the cover plate adjacent to a side of the gas injector.

DETAILED DESCRIPTION

Embodiments of this invention are described in detail below. However, in addition to that described, this invention can be broadly implemented in the other cases. Furthermore, to provide a clear description, pieces within the schema may not be in accordance with their relative sizes, scales may be exaggerated, and details not related completely may be drawn in part for schematic simplicity.

One embodiment of the invention is related to a deposition process system for semiconductor equipment comprising a gas injector and cover plate assembly. The deposition process system comprises a reaction chamber enclosing a process space, a gas delivery apparatus and a gas processing apparatus with the gas injector and cover plate assembly. The deposition process system can be used in a thin film deposition process, such as a metal-organic chemical vapor deposition process. The gas injector and cover plate assembly are located above or at a side of the process space, while a substrate susceptor is located beneath the process space or at the other side of the process space. The substrate susceptor is utilized to sustain a substrate thereon for processing. Typical substrates loaded into the deposition process system for processing may include, for example, silicon wafer, sapphire substrate, silicon carbide substrate or gallium nitride or III-V group semiconductor substrates. It is noted that other substrates such as glass substrates can also be loaded into the deposition process system for processing. It is also noted that any design of a reaction chamber enclosing a process space and gas delivery apparatus can be applied in the deposition process system and therefore will not be specifically described herein. The deposition process system can further include other devices or components which are known in the art. Components related to the gas injector and cover plate assembly will be further described in detail.

Figure 1:
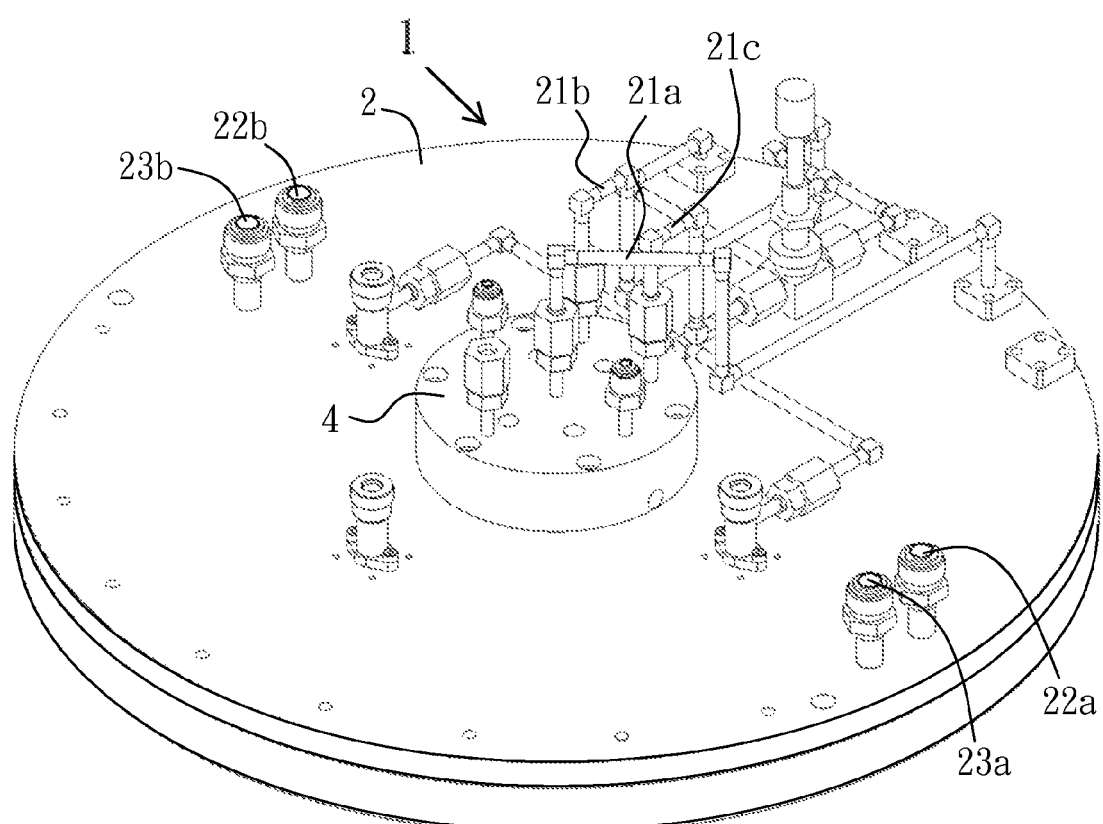
FIG. 1 shows a gas injector and cover plate assembly applied to a deposition process system for semiconductor equipment according to one embodiment of the invention.

FIG. 1 shows a gas injector and cover plate assembly applied to a deposition process system for semiconductor equipment according to an embodiment of the invention. The gas injector and cover plate assembly 1 is configured to be located above the reaction chamber and the substrate susceptor of the semiconductor equipment during a thin film deposition process. In one embodiment, the gas injector and cover plate assembly 1 comprise a cover plate 2 and a gas injector 4. A first gas conduit 21a, a second gas conduit 21b and a third gas conduit 21c for introducing three types of gases into the gas injector 4 are also shown in the figure. First cooling fluid inlet 22a and outlet 22b and second cooling fluid inlet 23a and outlet 23b for introducing two types of cooling fluids into and out from the cover plate 2, respectively, are also shown in FIG. 1. Embodiments of the cover plate 2 and the gas injector 4 will be described in detail in the following content.

Figure 2:
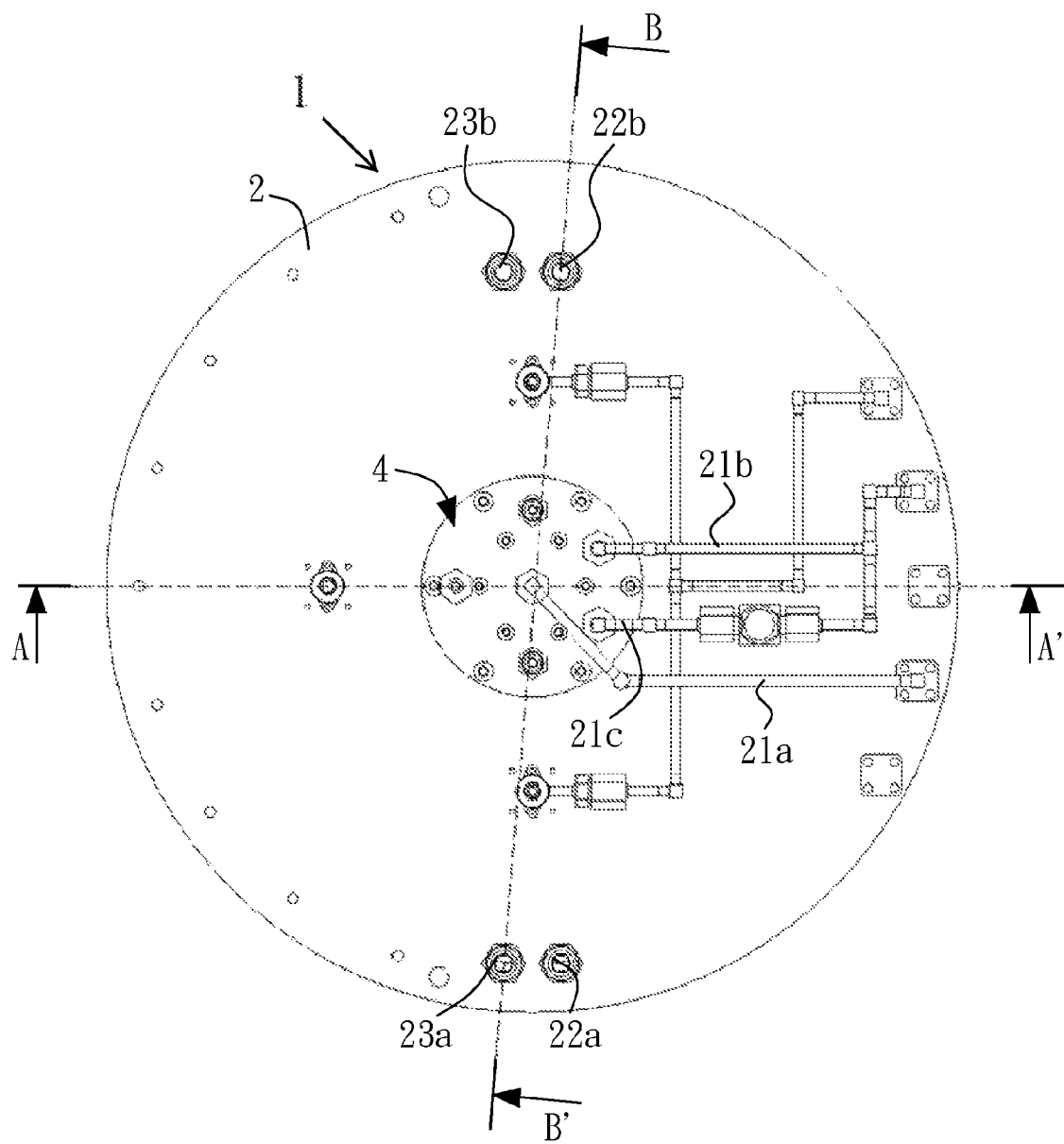
FIG. 2 is a top view of the gas injector and cover plate assembly.
Figure 2A:
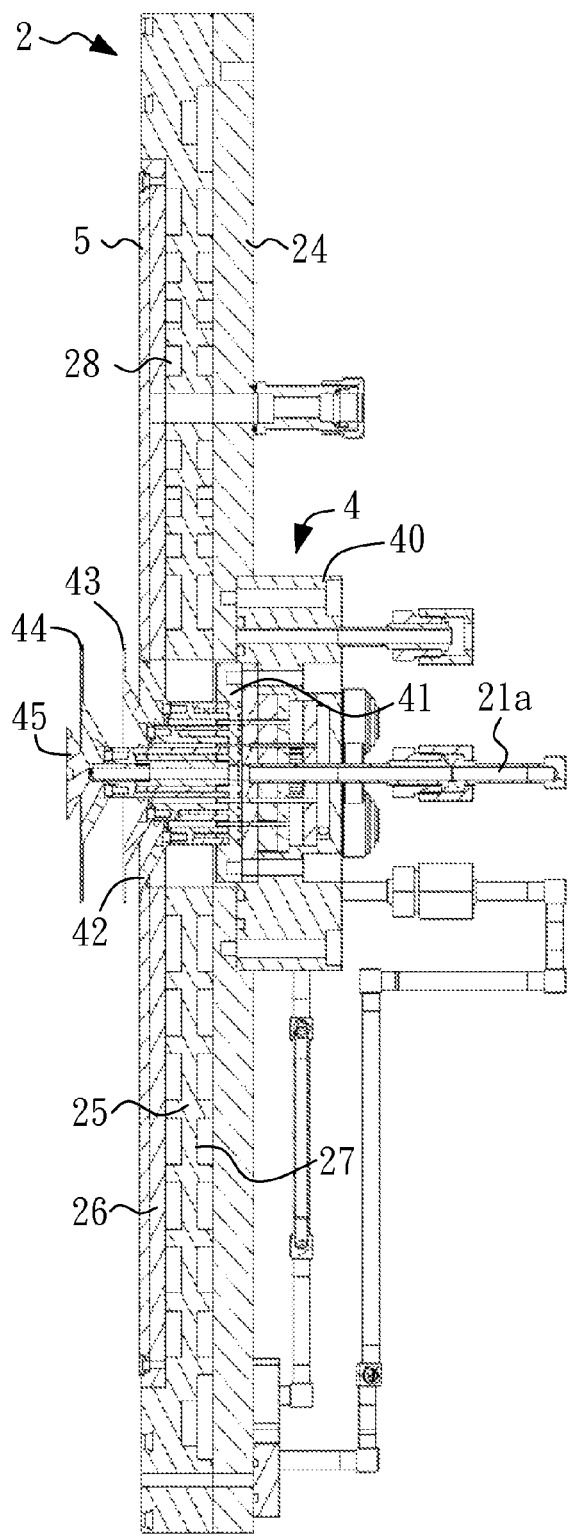
FIGS. 2A and 2B are cross-sectional views of the gas injector and cover plate assembly of FIG. 2 along the directions of A-A' and B-B' respectively.
Figure 2B:
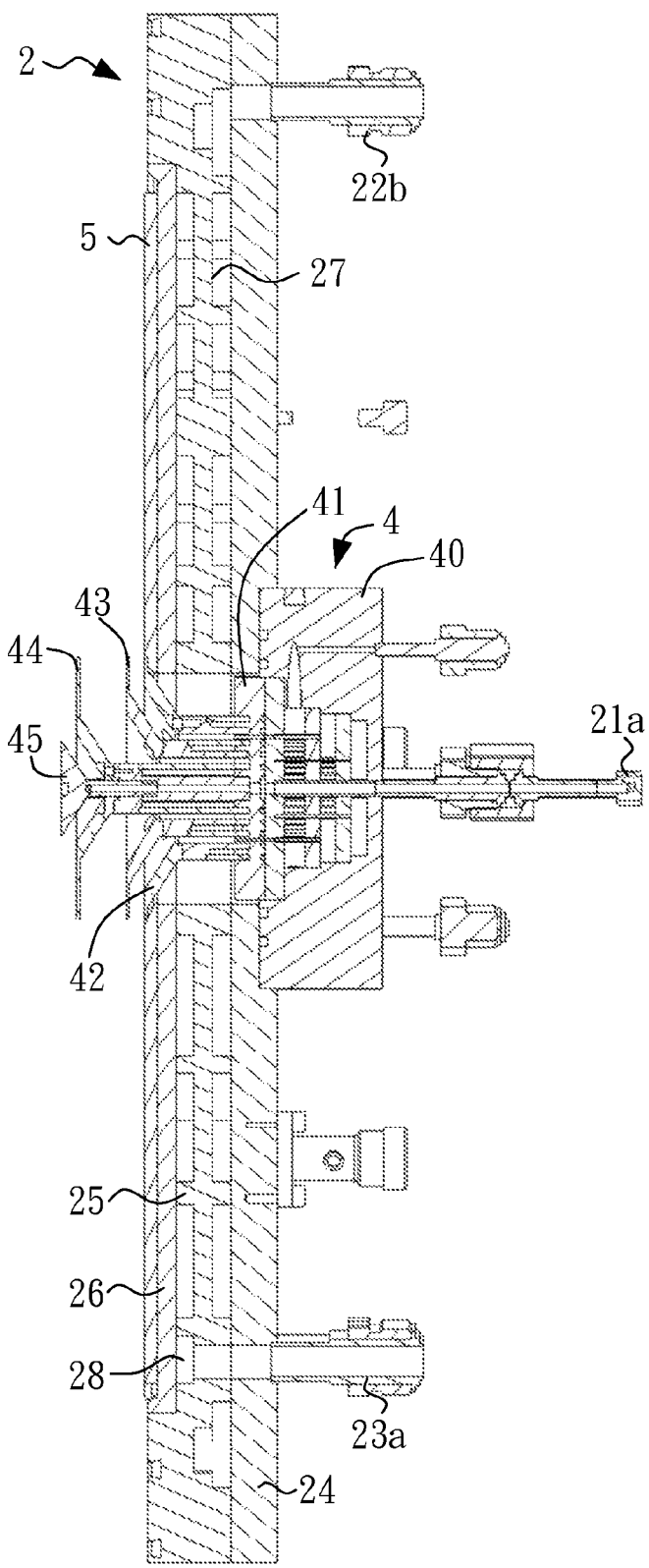

FIG. 2 is a top view of the gas injector and cover plate assembly applied to a deposition process system for semiconductor equipment according to an embodiment of the invention. FIGS. 2A and 2B are cross-sectional views of the gas injector and cover plate assembly of FIG. 2 along the directions of A-A' and B-B' respectively. In one embodiment, as shown in FIG. 2A, the cover plate 2 has two layers of cooling fluid channels 27 and 28. The first and second cooling fluid channels 27 and 28 are formed by an upper plate 24, a partition plate 25, a lower plate 26 and a ceiling 5. The material of the ceiling comprises quartz. The upper space formed by the upper plate 24 and the partition plate 25 is the first cooling fluid channel 27, while the lower space formed by the partition plate 25 and the lower plate 26 is the second cooling fluid channel 28. The first and second cooling fluid channels 27 and 28 comprise whirling cooling fluid channels. The first and second cooling fluid channels 27 and 28 can be used to introduce fluids with different thermal conductivities and temperatures, or the same fluid with different temperatures respectively to form a high to low temperature gradient. The temperature of the ceiling 5 attached to the lower plate 26 of the cover plate 2 is adjusted via thermal conduction to prevent the accumulation of particles formed by reaction gases on the ceiling 5 and the subsequent dropping of the particles on the substrate such as a wafer during a deposition process.

FIG. 2A also shows a structure of the gas injector 4 according to an embodiment of the invention. In this embodiment, the gas injector 4 comprises a plurality of components and has a function of horizontally injecting three layers of gases. The gas injector 4 comprises a gas distributor 40, a fluid-cooling gas transmitter 41, a first gas spraying plate 42, a second gas spraying plate 43, a third gas spraying plate 44 and a conducting cone 45. The gas distributor 40, the fluid-cooling gas transmitter 41, the first gas spraying plate 42, the second gas spraying plate 43, the third gas spraying plate 44 and the conducting cone 45 are sequentially mounted on the cover plate 2 to form the gas injector and cover plate assembly. The ceiling 5 is pressed by the edge of the first gas spraying plate 42 and is attached on the lower surface of the lower plate 26 of the cover plate 2 so as to be mounted on the cover plate 2. The ceiling can be secured on the cover plate 2 via screws on the circumference of the cover plate 2. The embodiment of the gas injector 4 is described in detail in the following content.

FIG. 2B which is a cross-sectional view of the gas injector and cover plate assembly of FIG. 2 along the direction of B-B'. As can be seen, the second cooling fluid inlet 23a connects the second cooling fluid channel 28, and the first cooling fluid outlet 22b connects the first cooling fluid channel 27. With reference to FIGS. 1, 2 and 2B, the first cooling fluid inlet 22a and the second cooling fluid inlet 23a are used to introduce two fluids with different thermal conductivities and temperatures into the first and second cooling fluid channels 27 and 28 of the cover plate 2. The fluids flow out from the cover plate 2 through the first cooling fluid outlet 22b and the second cooling fluid outlet 23b.

In one embodiment, during a deposition process, the first cooling fluid with a lower temperature flows into the cover plate 2 via the first cooling fluid inlet 22a. The first cooling fluid then flows through the whirling first cooling fluid channel 27 to cool the partition plate 25 and to control thermal energy transmitting to the upper plate 24, and then flows out from the cover plate 2 via the first cooling fluid outlet 22b. The second cooling fluid with a higher temperature flows into the cover plate 2 via the second cooling fluid inlet 23a. The second cooling fluid then flows through the whirling second cooling fluid channel 28 to cool the lower plate 26 and to control thermal energy transmission to the partition plate 25, and then flows out from the cover plate 2 via the second cooling fluid outlet 23b. Through the different thermal conductivities and temperatures of the first and second cooling fluids, the transmission of thermal energy during the deposition process can be controlled and the temperature of the ceiling 5 can be adjusted by controlling the thermal conduction so as to prevent the accumulation of particles formed by reaction gases on the ceiling 5 and the subsequent dropping of the particles on a processing substrate or a wafer during a deposition process.

Figure 3:
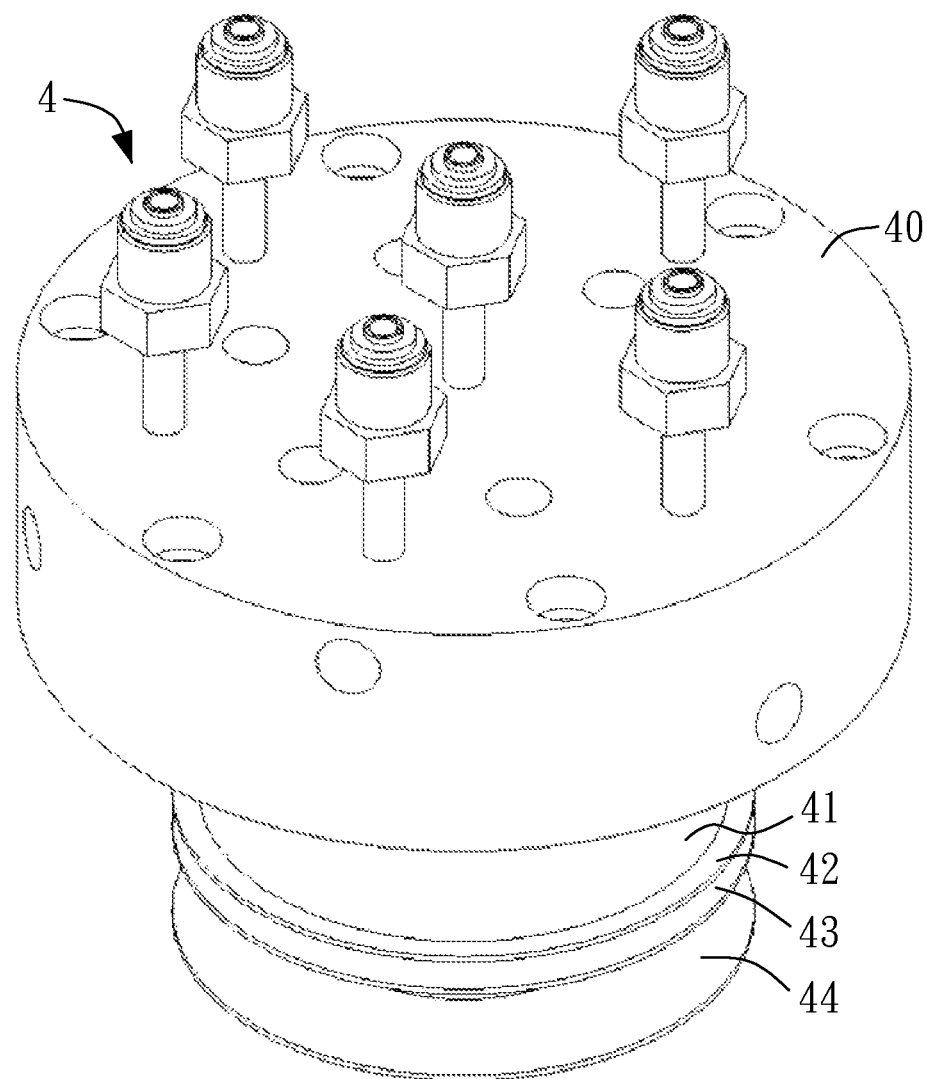
FIG. 3 shows a gas injector applied to an item of semiconductor equipment according to one embodiment of the invention.
Figure 4:
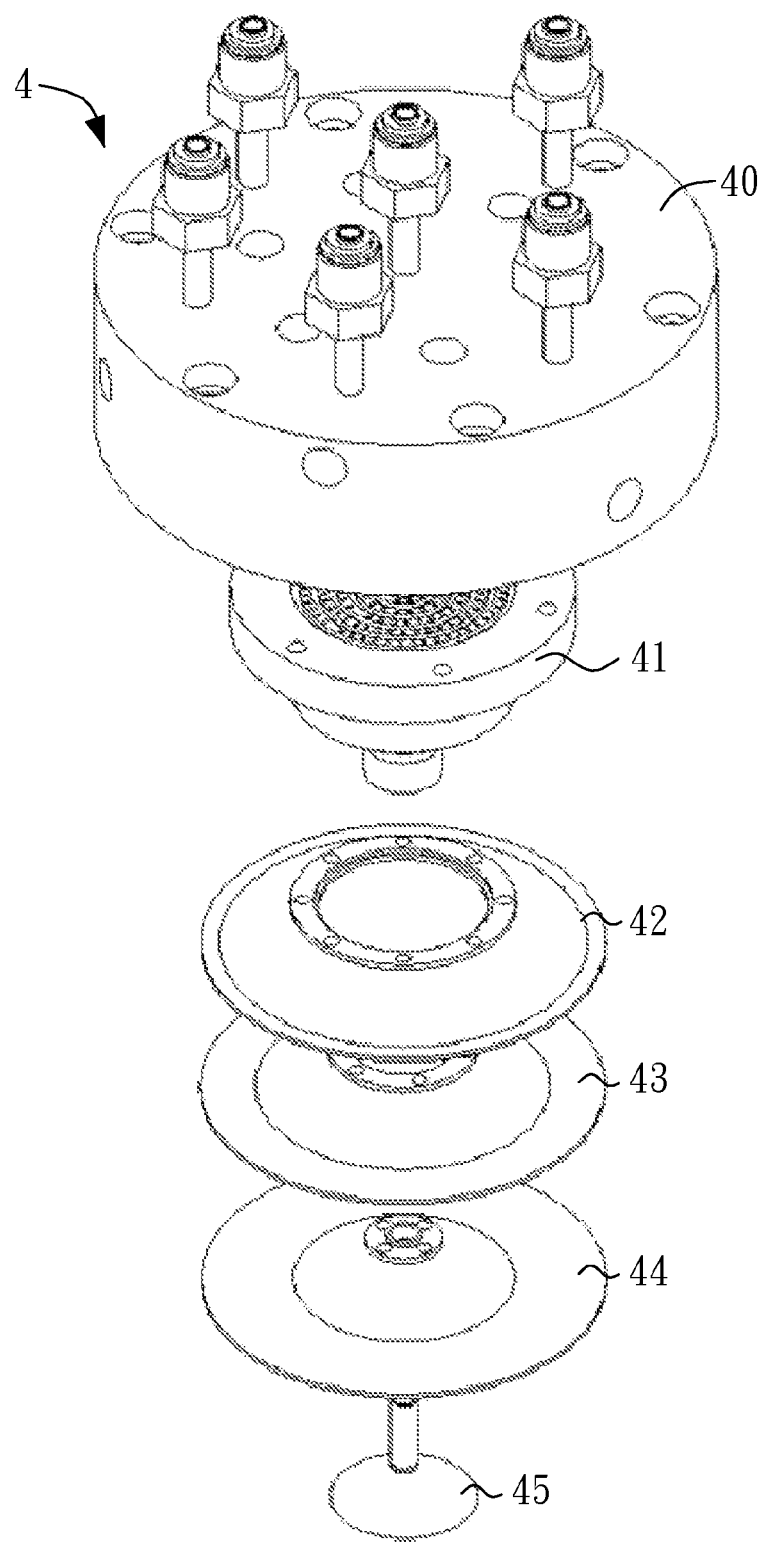
FIG. 4 is an exploded view of a gas injector applied to semiconductor equipment according to an embodiment of the invention.
Figure 5:
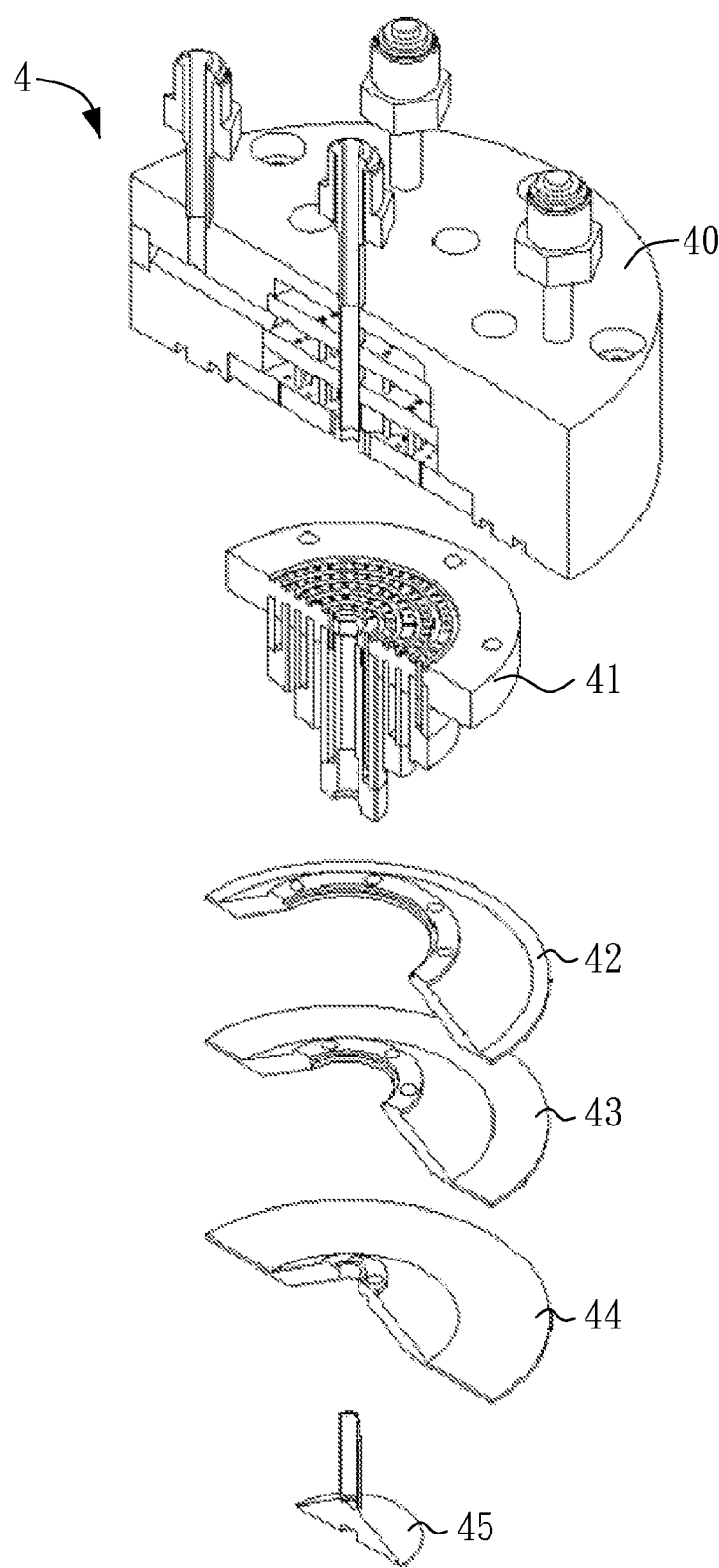
FIG. 5 is an exploded and cross-sectional view of a gas injector applied to semiconductor equipment according to an embodiment of the invention.

FIG. 3 shows a gas injector applied to semiconductor equipment according to an embodiment of the invention. FIG. 4 is an exploded view of a gas injector applied to semiconductor equipment according to an embodiment of the invention. FIG. 5 is an exploded and cross-sectional view of a gas injector applied to semiconductor equipment according to an embodiment of the invention. In one embodiment, the gas injector 4 comprises the gas distributor 40, the fluid-cooling gas transmitter 41, the first gas spraying plate 42, the second gas spraying plate 43, the third gas spraying plate 44 and the conducting cone 45. The embodiment of the gas injector 4 is described in detail in that which follows.

Figure 6:
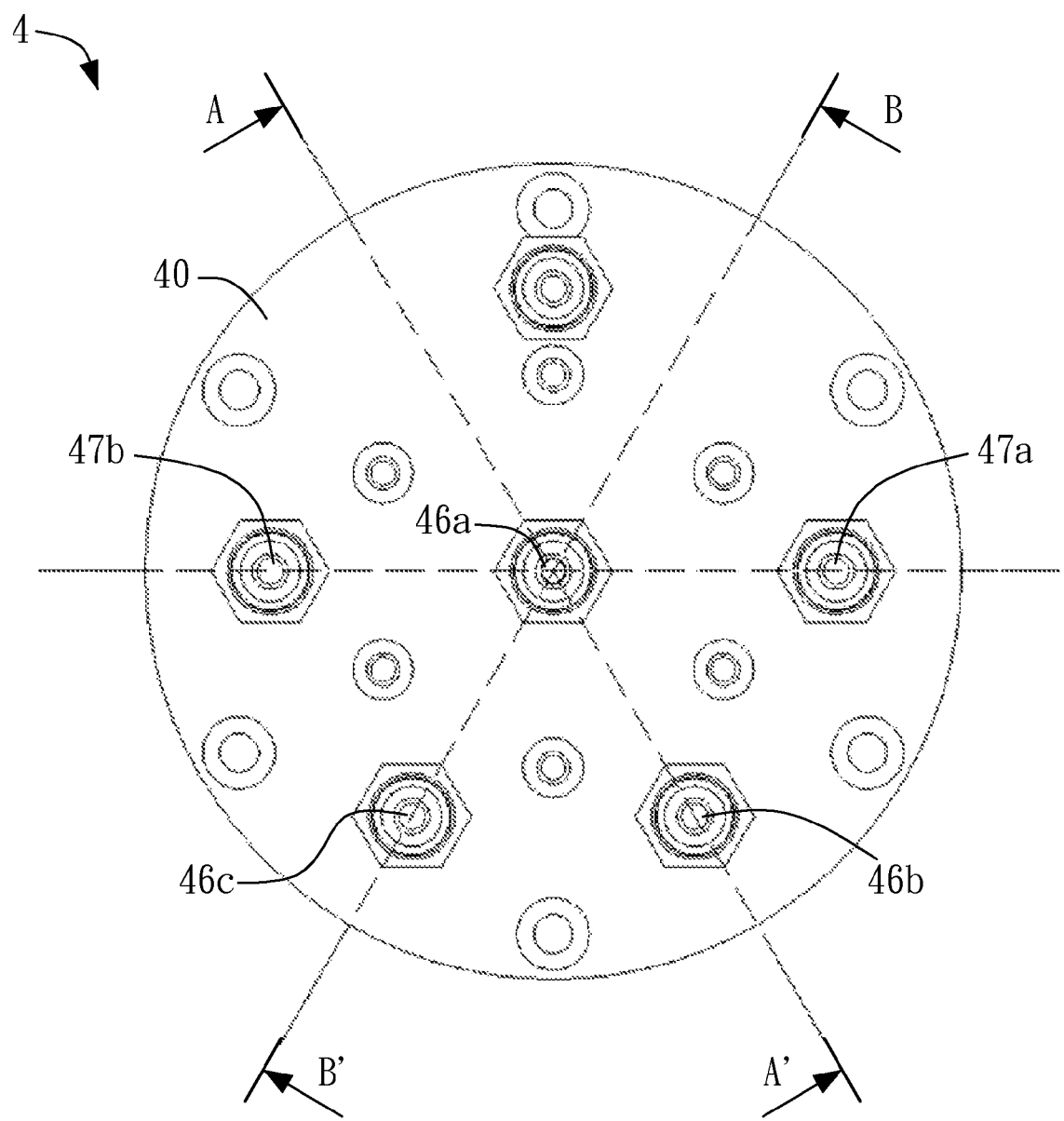
FIG. 6 is a top view of a gas injector according to an embodiment of the invention.

FIG. 6 is a top view of a gas injector according to an embodiment of the invention. FIG. 6 shows a first gas connector 46a, a second gas connector 46b and a third gas connector 46c for connecting the first gas conduit 21a, the second gas conduit 21b and the third gas conduit 21c of FIG. 1, respectively, as well as cooling fluid connectors 47a and 47b.

Figure 6A:
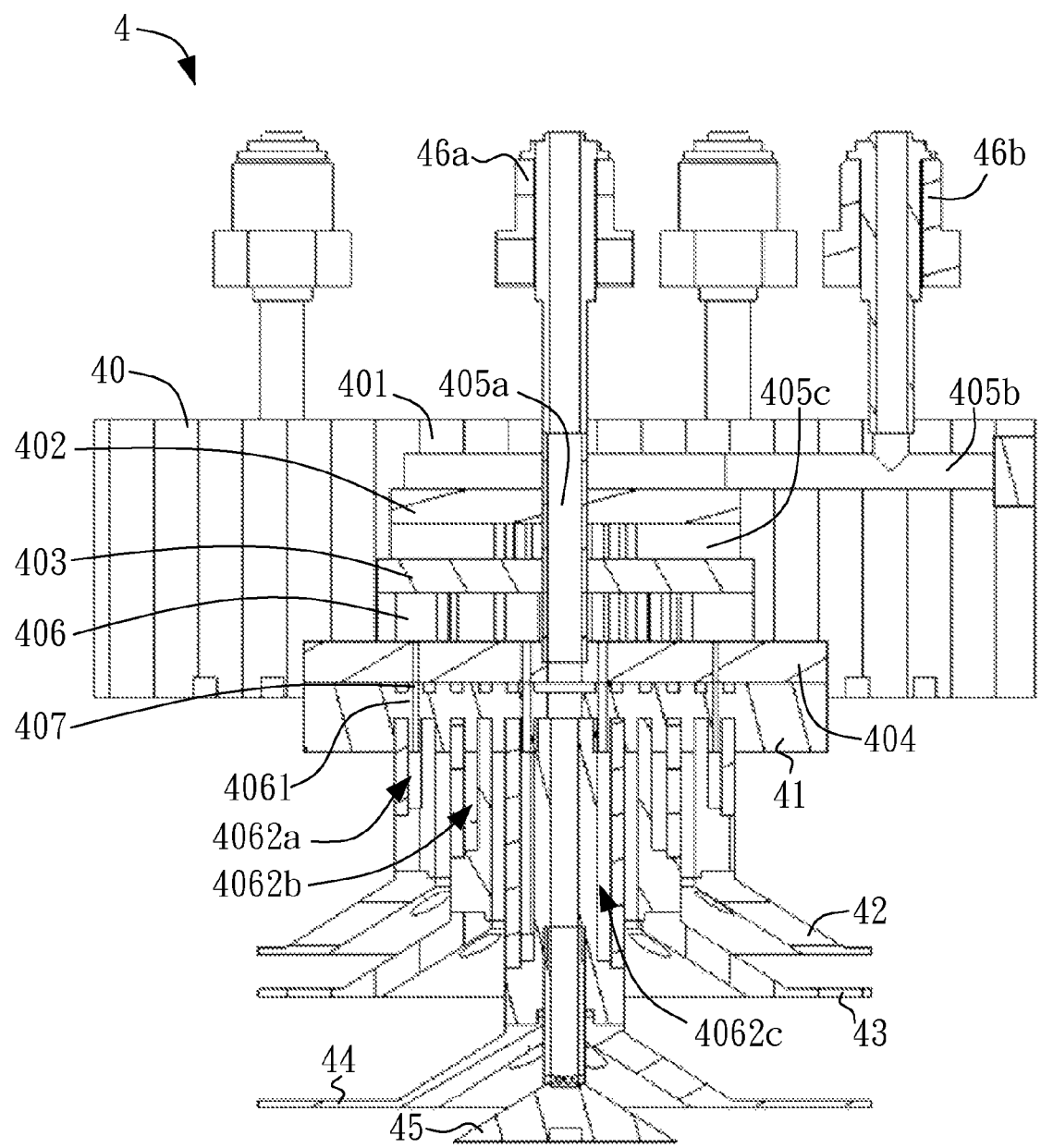
FIGS. 6A, 6B and 6C are cross-sectional views of the gas injector of FIG. 6 along the directions of A-A', B-B' and C-C', respectively.
Figure 6B:
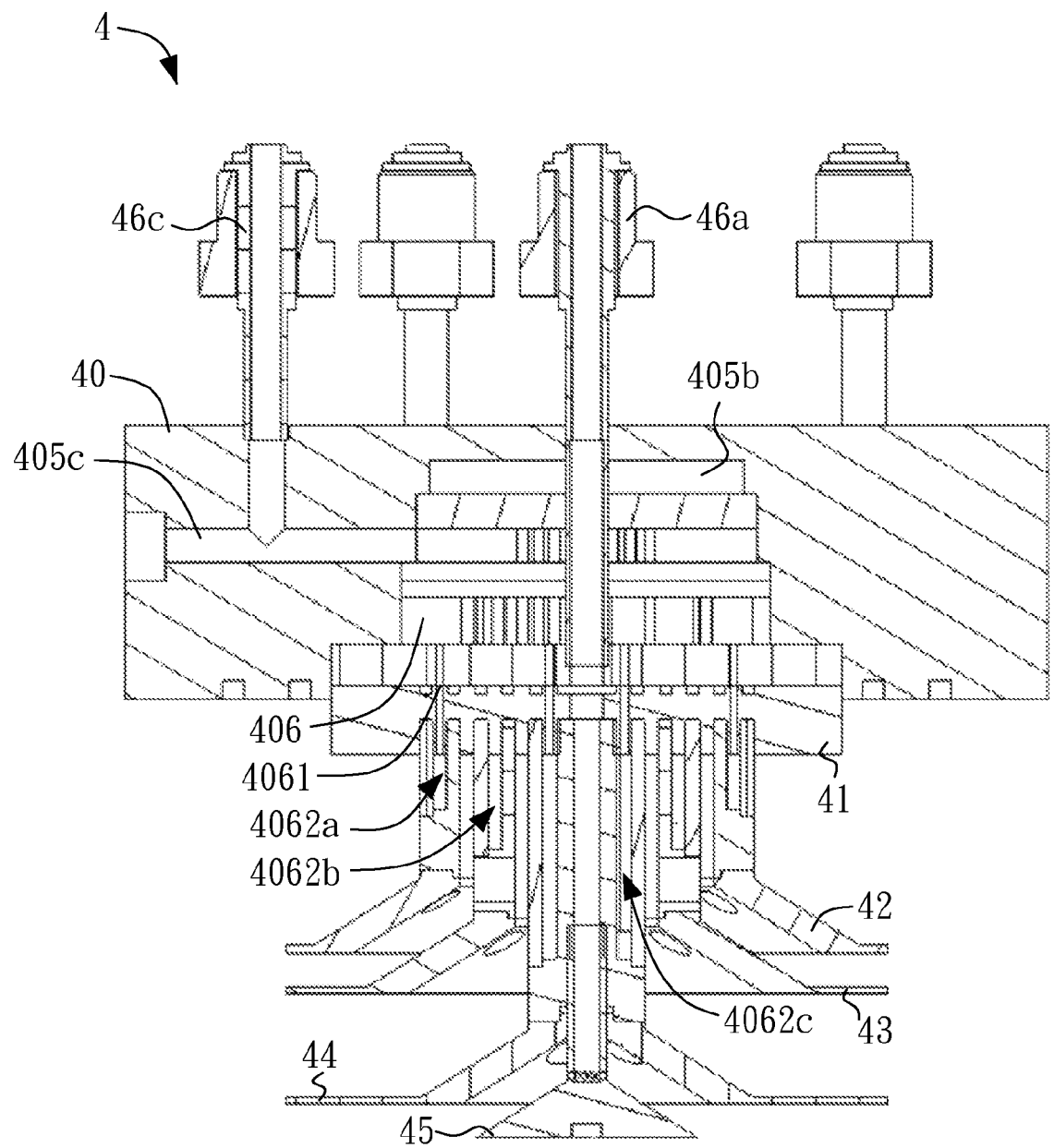
Figure 6C:
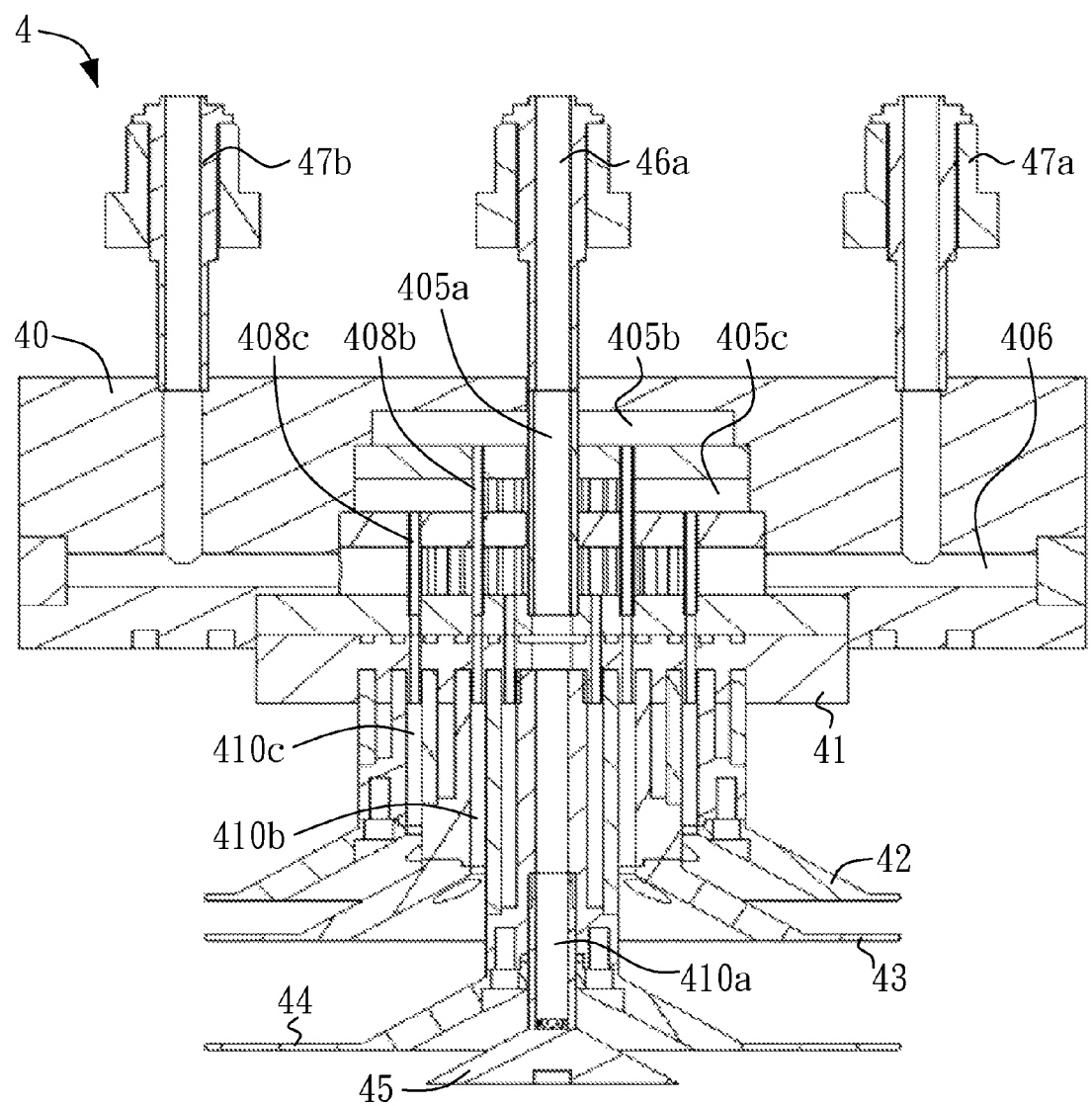

FIGS. 6A, 6B and 6C are cross-sectional views of the gas injector of FIG. 6 along the directions of A-A', B-B' and C-C' respectively. With reference to FIG. 6A, in one embodiment of the invention, the gas distributor 40 has a structure with three layers of space. A gas conduit 405a is located in the center of the gas distributor 40 for introducing a first gas from the first gas conduit 21a and the first gas connector 46a. The upper space is constituted by a housing 401 and a first partition 402 to form a second gas plenum 405b, and a second gas is introduced from the second gas connector 46b on the housing 401. The middle space is constituted by the first partition 402 and a second partition 403 to form a third gas plenum 405c, and a third gas is introduced from the third gas conduit 21c and the third gas connector 46c on the housing 401 (cf. FIG. 6B). The lower space is constituted by the second partition 403 and a third partition 404 to form a fluid cooling plenum 406, and a cooling fluid is introduced from the cooling fluid connectors 47a and 47b on the housing 401 (cf. FIG. 6C) and flows through the lower space. The first partition 402, the second partition 403 and the third partition 404 comprise gas or fluid spraying plates with porous single circle or multi-circles and uniform spraying function of showerhead.

In one embodiment of the invention, the structure with three layers of space of the gas distributor 40 comprises the second gas plenum 405b, second conduits 408b secured by brazing, the third gas plenum 405c and third conduits 408c secured by brazing identical to a showerhead with three layers. The upper space of the gas distributor 40 is the second gas plenum 405b, and the bottom plate of the second gas plenum 405b is the first partition 402. The first partition 402 comprises a gas spraying plate with porous single circle or multi-circles. The middle space of the gas distributor 40 is the third gas plenum 405c, and the bottom plate of the third gas plenum 405c is the second partition 403. The second partition 403 comprises a gas spraying plate with porous single circle or multi-circles. The second conduits 408b are through holes of the first partition 402, the second partition 403 and the bottom plate of the fluid cooling plenum 406 or the third partition 404. These three through interfaces can be sealed by brazing. The third conduits 408c are through holes of the second partition 403 and the third partition 404. These two through interfaces can be sealed by brazing.

In another embodiment of the invention, the second conduit 408b and the third conduit 408c extend into or connect second gas channels 410b and third gas channels 410c of the fluid-cooling gas transmitter 41. A second gas can be uniformly distributed via the first partition 402 and the second conduit 408b and then flows downward through the second gas channels 410b of the fluid-cooling gas transmitter 41, and flows horizontally from the space between the second gas spraying plate 43 and the third gas spraying plate 44. A third gas can be uniformly distributed via the second partition 403 and the third conduit 408c and then flows downward through the third gas channels 410c of the fluid-cooling gas transmitter 41, and flows horizontally from the space between the first gas spraying plate 42 and the second gas spraying plate 43. The gas conduit 405a of the gas distributor 40 is a pass way for a first gas and connects a first gas channel 410a of the fluid-cooling gas transmitter 41 below. The top portion of the conducting cone 45 connecting the first gas channel 410a has a plurality of openings with a function similar to that of a gas spraying plate. A first gas flows downward through the first gas channels 410a of the fluid-cooling gas transmitter 41 via the gas conduit 405a of the gas distributor 40, and flows horizontally from the space between the third gas spraying plate 44 and the conducting cone 45. The gases in the second gas plenum 405b and the third gas plenum 405c flow downward via the second conduit 408b and the third conduit 408c respectively without mixing.

In accordance with another embodiment of the invention, a cooling fluid flows downward to one side of a plurality of cooling fluid walls 4062a-4062c of the fluid-cooling gas transmitter 41 via a plurality of independent channels 4061 at a side of the fluid cooling plenum 406. The cooling fluid then flows around a circle to the other side of the fluid cooling plenum 406, and then flows out through the cooling fluid connectors 47a and 47b (cf. FIG. 6C). As mentioned, the cooling fluid in the cooling fluid walls 4062a-4062c of the fluid-cooling gas transmitter 41 flows into the fluid-cooling gas transmitter 41 through the openings of the fluid cooling plenum 406 of the gas distributor 40 which are the openings of the connection between the independent channels 4061 and the third partition 404. The independent channels 4061 are between the first gas channels 410a and the second gas channels 410b, and between the second gas channels 410b and the third gas channels 410c. The cooling fluid wall 4062c is between the first gas channels 410a and the second gas channels 410b. The cooling fluid wall 4062b is between the second gas channels 410b and the third gas channels 410c. The cooling fluid wall 4062a is between the third gas channels 410c and the housing of the fluid-cooling gas transmitter 41. A plurality of O rings 407 can be used to seal the connection between the third partition 404 of the gas distributor 40 and the fluid-cooling gas transmitter 41 so as to facilitate vertical flow of gases and cooling fluid and lateral isolation of fluids to avoid leakage of fluids. The end of the independent channels 4061 toward the fluid cooling plenum 406 is at the same level with the third partition 404. The fluid-cooling gas transmitter 41 can be formed by inserting processed plates into trenches of an upper plate and connecting by brazing. The fluid-cooling gas transmitter 41 can be secured on the gas distributor 40 by screws.

With reference to FIG. 6B, which is the cross-sectional view of the gas injector of FIG. 6 along the direction of B-B', a third gas is introduced into the third gas plenum 405c through the third gas conduit 21c and the third gas connector 46c on the housing 401, and then flows to the fluid-cooling gas transmitter 41 via the uniform distribution (e.g. uniform distributing capability) of the second partition 403 of the gas distributor 40.

In FIG. 6C is the cross-sectional view of the gas injector of FIG. 6 along the direction of C-C'. In addition to the gas conduit 405a for introducing the first gas from the first gas conduit 21a and the first gas connector 46a to the conducting cone 45, FIG. 6C shows the second conduit 408b and the third conduit 408c in the gas distributor 40 for introducing the second and third gases from the second gas plenum 405b and the third gas plenum 405c to the gas distributor 40. The second conduit 408b can be mounted in the first partition 402, the second partition 403 and the third partition 404 by brazing, to introduce the second gas in the second gas plenum 405b to the second gas channels 410b of the fluid-cooling gas transmitter 41. Then, the second gas can flow horizontally from the space between the second gas spraying plate 43 and the third gas spraying plate 44. The third conduit 408c can be mounted in the second partition 403 and the third partition 404 by brazing to introduce the third gas. Following such introduction of the third gas in the third gas plenum 405c to the third gas channels 410c of the fluid-cooling gas transmitter 41, the third gas can flow horizontally from the space between the first gas spraying plate 42 and the second gas spraying plate 43. The gas conduit 405a of the gas distributor 40 and the first gas channels 410a of the fluid-cooling gas transmitter 41 constitute an independent tubulous space to introduce the first gas. This independent tubulous can allow introduction of the first gas from the first gas connector 46a on the housing 401 of the gas distributor 40 to the space between the third gas spraying plate 44, the conducting cone 45 and a substrate susceptor through the gas conduit 405a of the gas distributor 40 and the first gas channels 410a of the fluid-cooling gas transmitter 41. The first gas flows horizontally from the space between the third gas spraying plate 44, the conducting cone 45 and the substrate susceptor. The bottom surface of the conducting cone 45 is at the same level with the upper surface of the substrate susceptor. The housing 401, the first partition 402, the second partition 403, the third partition 404, the second conduit 408b and the third conduit 408c are secured by brazing to prevent gas leakage.

In one embodiment of the invention, the first gas spraying plate 42, the second gas spraying plate 43, the third gas spraying plate 44 and the conducting cone 45 are components used for changing gas flow direction. The first gas spraying plate 42, the second gas spraying plate 43, the third gas spraying plate 44 and the conducting cone 45 comprise gas spraying plates with an inverted cone shape having a disc circular edge, and/or gas spraying plates with an inverted bowl shape having a curvature, and/or gas spraying plates with a hollow center and a gradually increased thickness from the center to the circumference. The circumference edges of the first gas spraying plate 42, the second gas spraying plate 43 and the third gas spraying plate 44 have holes for using fasteners such as screws to secure the first gas spraying plate 42, the second gas spraying plate 43 and the third gas spraying plate 44 beneath the cooling fluid walls 4062a-4062c of the fluid-cooling gas transmitter 41 to form a structure for altering gas flow direction. The combination of the first gas spraying plate 42 and the second gas spraying plate 43 is to change downward flow of the third gas to horizontal flow. The combination of the second gas spraying plate 43 and the third gas spraying plate 44 is to change downward flow of the second gas to horizontal flow. The combination of the third gas spraying plate 44 and the conducting cone 45 together with the substrate susceptor is to change downward flow of the first gas to horizontal flow. The first gas spraying plate 42, the second gas spraying plate 43, the third gas spraying plate 44 and the conducting cone 45 can be secured on the fluid-cooling gas transmitter 41 via screws.

In another embodiment, the pitch and the incline angle between the first gas spraying plate 42 and the second gas spraying plate 43 are adjustable to alter the height of the fluid wall(s) and the structures of the first gas spraying plate 42 and the second gas spraying plate 43. The adjustability is enabled, for example, by operation of the first gas spraying plate 42, the second gas spraying plate 43, the third gas spraying plate 44 and the conducting cone 45 being secured, for instance, by screws. The pitch and the incline angle between the second gas spraying plate 43 and the third gas spraying plate 44 are also adjustable to change the height of fluid wall and the structures of the second gas spraying plate 43 and the third gas spraying plate 44. The pitch and the incline angle between the third gas spraying plate 44 and the conducting cone 45 are also adjustable to change the height of the first gas channels 410a and/or the structures of the third gas spraying plate 44 and/or the conducting cone 45.

According to another embodiment, the bottom of the first gas spraying plate 42 is at the same level with the bottom of the ceiling 5. The conducting cone 45 comprises a cone, wherein the outer diameter of the first gas channels 410a is slightly smaller than the inner diameter of the gas conduit 405a, and the first gas channels 410a are secured inside the gas conduit 405a. The top portion of the conducting cone 45 connecting the first gas channels 410a has a plurality of openings with a function similar to that of a uniform-distribution plate with a porous structure.

With reference to a further embodiment, the conducting cone 45, the third gas spraying plate 44 and the substrate susceptor can form a structure for altering flow direction of the first gas. The bottom surface of the conducting cone 45 is at the same level with the upper surface of the substrate susceptor. The first gas can flow downward through the first gas channels 410a via the openings and exit horizontally from the space between the third gas spraying plate 44 and the substrate susceptor.

In the embodiments set forth above, the cover plate with the first and second cooling fluid channels 27 and 28 for introducing fluids with different thermal conductivities and temperatures constitutes only one example(s) of establishing a high to low temperature gradient. Hence, the number and structure of cooling fluid channels in the cover plate are not provided to be construed as limitations. Moreover, the gas plenums formed by the partitions relating to the number of gases to be introduced are not limited to the embodiment set forth, either. Furthermore, the arrangements, shapes and structures of the first gas spraying plate 42, the second gas spraying plate 43, the third gas spraying plate 44 and the conducting cone 45 are examples, not limitations. In addition to incline angle and pitch, thickness and curvature of the first gas spraying plate 42, the second gas spraying plate 43 and the third gas spraying plate 44 can also be adjustable features.

Although specific embodiments of the invention have been described, it will be understood by those of skill in the art that there are other embodiments which may be equivalent to the described embodiments. Accordingly, it is to be understood that the invention is to be limited not by the specific illustrated embodiments but by the scope of the appended claims.

What is claimed is:

1. A gas injector and cover plate assembly, comprising:
    a cover plate comprising a plurality of cooling fluid channels for introducing a plurality of cooling fluids with different temperatures to form a temperature gradient;
    a gas injector attached to the cover plate comprising:
        a gas distributor uniformly distributing a plurality of gases and a cooling fluid, the gas distributor comprising a gas conduit through the gas distributor for introducing a first gas;
        a fluid-cooling gas transmitter connecting the gas distributor comprising:
            a plurality of independent channels for introducing the cooling fluids to form a plurality of cooling fluid walls;
            a first gas channel connecting the gas conduit; and
            a plurality of gas channels for introducing the gases;
            wherein the independent channels being between the two adjacent gas channels, and outside the gas channels; and
        a plurality of gas spraying plates and a conducting cone being sequentially located beneath the fluid-cooling gas transmitter, the two adjacent gas spraying plates changing a flow direction of one of the gases, and the gas spraying plate and the conducting cone changing a flow direction of the first gas, wherein the gas spraying plates comprise three gas spraying plates with an inverted cone shape having a disc circular edge, three gas spraying plates with an inverted bowl shape having a curvature, or three gas spraying plates with a hollow center and a gradually increased thickness from the center to the circumference; and
    a ceiling attached to a surface of the cover plate and adjacent one side of the gas injector.

2. The gas injector and cover plate assembly of claim 1, wherein the cooling fluid channel adjacent the ceiling introduces the cooling fluid with a highest temperature.

3. The gas injector and cover plate assembly of claim 1, wherein the cooling fluids comprise a plurality of cooling fluids with different thermal conductivities.

4. The gas injector and cover plate assembly of claim 1, wherein the gas distributor comprises:
    a housing and a plurality of partitions, each partition comprises a plurality of openings to uniformly distribute the gases and the cooling fluids, the gas conduit is through the housing, the partitions for introducing the first gas; and
    a plurality of conduits, each the conduit is in each the opening and through the partition for transmitting the gases.

5. The gas injector and cover plate assembly of claim 4, wherein the partitions comprise gas spraying plates with porous multi-circles.

6. The gas injector and cover plate assembly of claim 1, wherein the gas spraying plates comprise gas spraying plates each with a disc circular edge.

7. The gas injector and cover plate assembly of claim 1, wherein a bottom surface of the conducting cone is at the same level with an upper surface of the substrate susceptor.

8. The gas injector and cover plate assembly of claim 1, wherein a top portion of the conducting cone connecting the gas conduit has a plurality of openings.

9. A gas injector and cover plate assembly, comprising:
    a cover plate comprising a plurality of cooling fluid channels for introducing a plurality of cooling fluids with different temperatures to form a temperature gradient;
    a gas injector attached to the cover plate comprising:
        a gas distributor uniformly distributing a plurality of gases and a cooling fluid, the gas distributor comprising a gas conduit through the gas distributor for introducing a first gas;
        a fluid-cooling gas transmitter connecting the gas distributor comprising:
            a plurality of independent channels for introducing the cooling fluids to form a plurality of cooling fluid walls;
            a first gas channel connecting the gas conduit; and
            a plurality of gas channels for introducing the gases;
            wherein the independent channels being between the two adjacent gas channels, and outside the gas channels; and
        a plurality of gas spraying plates and a conducting cone being sequentially located beneath the fluid-cooling gas transmitter, the two adjacent gas spraying plates changing a flow direction of one of the gases, and the gas spraying plate and the conducting cone changing a flow direction of the first gas, wherein a pitch and an incline angle between the gas spraying plate and the conducting cone are adjustable; and
    a ceiling attached to a surface of the cover plate and adjacent one side of the gas injector.

* * * * *